United States Patent [19]

Noguchi et al.

[11] 4,353,047
[45] Oct. 5, 1982

[54] (1−X)BAO.XTIO₂ SYSTEM DIELECTRIC MATERIAL FOR USE IN A MICROWAVE DEVICE

[75] Inventors: Tsutomu Noguchi; Yuji Kajiwara; Masanori Suzuki; Hideo Takamizawa, all of Tokyo, Japan

[73] Assignee: Nippon Electric Co., Ltd., Tokyo, Japan

[21] Appl. No.: 258,355

[22] Filed: Apr. 28, 1981

Related U.S. Application Data

[62] Division of Ser. No. 116,413, Jan. 29, 1980, abandoned.

[30] Foreign Application Priority Data

Jan. 29, 1979 [JP] Japan .................................. 54-8967

[51] Int. Cl.³ .......................... H01P 1/00; C04B 35/49
[52] U.S. Cl. .................................. 333/247; 330/307; 333/35; 361/321; 501/137; 501/138
[58] Field of Search .................. 330/307; 333/247; 501/137, 138

[56] References Cited

U.S. PATENT DOCUMENTS 3,041,189 6/1962 Herbert ............................. 501/138
3,718,730 2/1973 Frey et al. ..................... 423/598 X
3,775,142 11/1973 Roup .............................. 501/136 X
3,938,064 2/1976 O'Bryan et al. ................. 501/137 X
4,004,256 1/1977 Duncan ........................... 333/247 X
4,026,811 5/1977 Readey et al. .................. 423/598 X
4,037,168 7/1977 Katoh et al. ....................... 330/306

FOREIGN PATENT DOCUMENTS 2158952 3/1973 Fed. Rep. of Germany ...... 501/138

Primary Examiner—Helen M. McCarthy
Attorney, Agent, or Firm—Sughrue, Mion, Zinn, Macpeak & Seas

[57] ABSTRACT

The present invention provides a dielectric material adapted for microwave integrated circuits (MIC) and an electric circuit making use of said dielectric material. More particularly, an oxide dielectric material principally consisting of $(1-x)BaO.xTiO_2$ ($0.7 \leq x \leq 0.95$) and containing both 0.007 to 0.7 weight % of manganese and 0.037 to 3.7 weight % of zirconium, has a large dielectric constant, a small dielectric loss and a small temperature coefficient of dielectric constant and is uniform over a broad range, and especially it is possible to easily manufacture a substrate having a uniform dielectric constant and a uniform dielectric loss. Transistors and MIC's employing such substrates can attain uniform and excellent high-frequency characteristics.

8 Claims, 11 Drawing Figures

FIG. 1(a)

| NO. | VALUE OF X | Mn₂O₃ (wt %) | ZrO₂ (wt %) | ε | Q-VALUE | f_T·K (PPM/°C) (-30 +60°C) |
|---|---|---|---|---|---|---|
| 48 | 0.8148 | 0.2 | 0.0 | 39.8 | 4800 | +12±4 |
| 49 | " | " | 1.0 | 39.6 | 5900 | +12±3 |
| 50 | " | " | 2.0 | 39.6 | 6300 | +8±2 |
| 51 | " | " | 4.0 | 39.8 | 5800 | +12±3 |
| 52 | " | " | 5.0 | 39.7 | 3400 | +21±4 |
| 53 | " | 0.3 | 0.0 | 39.7 | 4500 | +14±4 |
| 54 | 0.8500 | 0.0 | 1.0 | 40.6 | 5100 | +11±5 |
| 55 | " | 0.05 | 0.0 | 40.5 | 4500 | +23±6 |
| 56 | " | " | 1.0 | 40.6 | 5900 | +13±3 |
| 57 | " | " | 2.0 | 40.5 | 6600 | +6±3 |
| 58 | " | " | 4.0 | 40.2 | 5800 | +8±3 |
| 59 | " | " | 5.0 | 40.1 | 5500 | +14±4 |
| 60 | " | 0.1 | 1.0 | 40.4 | 5900 | +8±2 |
| 61 | " | " | 2.0 | 40.4 | 6200 | +3±3 |
| 62 | " | " | 3.0 | 40.1 | 5400 | +4±3 |
| 63 | " | " | 5.0 | 39.6 | 4700 | +8±3 |
| 64 | " | 0.2 | 1.0 | 40.2 | 5800 | +12±2 |
| 65 | " | " | 2.0 | 40.0 | 5900 | +9±2 |
| 66 | " | " | 3.0 | 40.0 | 6050 | +6±3 |
| 67 | " | " | 4.0 | 39.6 | 4200 | +12±3 |
| 68 | " | " | 5.0 | 39.5 | 4200 | +23±3 |
| 69 | 0.8750 | 0.05 | 1.0 | 46.4 | 5900 | +120±20 |
| 70 | " | " | 2.0 | 46.3 | 6400 | +70±20 |
| 71 | " | " | 4.0 | 46.5 | 5500 | +130±20 |
| 72 | " | 0.1 | 1.0 | 46.4 | 5800 | +100±20 |
| 73 | " | " | 2.0 | 46.4 | 5800 | +85±20 |
| 74 | " | " | 4.0 | 46.2 | 4600 | +120±20 |
| 75 | " | 0.2 | 1.0 | 46.4 | 5800 | +130±38 |
| 76 | " | " | 2.0 | 46.4 | 5900 | +95±30 |
| 77 | " | " | 4.0 | 46.5 | 3700 | +145±30 |
| 78 | 0.8800 | 0.05 | 1.0 | 46.8 | 4900 | +118±20 |
| 79 | | 0.1 | 2.0 | 46.1 | 5700 | +81±15 |
| 80 | 0.9500 | 0.1 | 1.0 | 65.0 | 4200 | +171±38 |
| 81 | 1.0000 | 0.05 | 2.0 | 89.0 | 4800 | +340±50 |

FIG.1(b)
| NO. | X | ε | | tan δ | a(ppm/°C) −20~+60°C |
|---|---|---|---|---|---|
| | | 1MHz | X-BAND | | |
| 1 | 0.60 | 1018 | 200 | >0.01 | −420±55 |
| 2 | 0.70 | 132 | 75 | 0.0008 | −105±21 |
| 3 | 0.74 | 51.9 | 52.5 | 0.00024 | −80±10 |
| 4 | 0.80 | 37.9 | 37.3 | 0.00014 | −26±4 |
| 5 | 0.808 | 39.2 | 38.8 | 0.00012 | −15±4 |
| 6 | 0.818 | 37.8 | 38.0 | 0.00014 | −3±3 |
| 7 | 0.868 | 51.2 | 51.5 | 0.00019 | −120±35 |
| 8 | 0.900 | 62.3 | 61.2 | 0.00022 | −340±42 |
| 9 | 0.950 | 78.0 | 76.3 | 0.0012 | −419±63 |
$$a = \frac{\Delta \varepsilon}{\varepsilon} \cdot \frac{1}{\Delta T}$$
FIG.2(a)
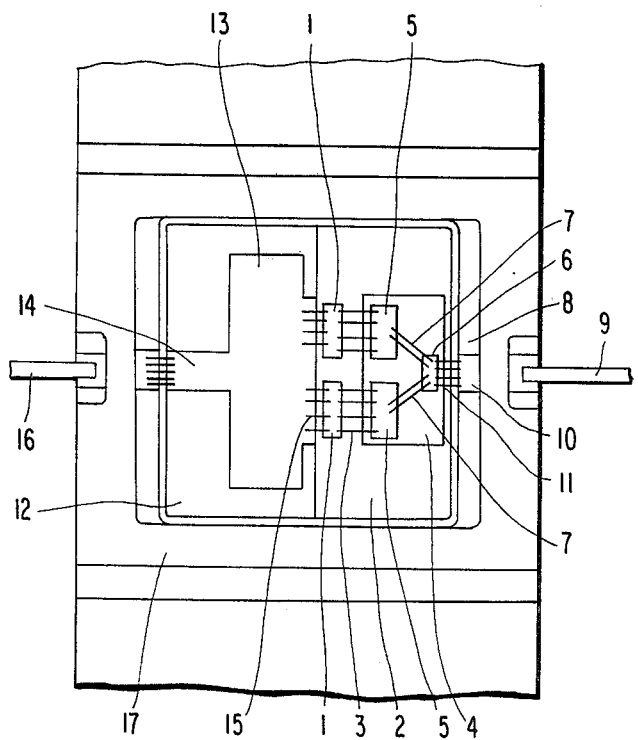
FIG.2(b)
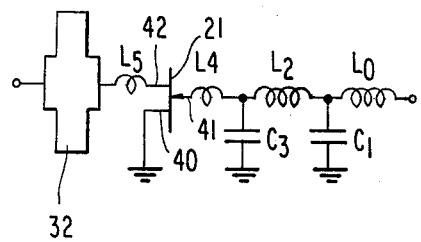

(1−X)BAO.XTIO$_2$ SYSTEM DIELECTRIC MATERIAL FOR USE IN A MICROWAVE DEVICE

This is a divisional of application Ser. No. 116,413, filed Jan. 29, 1980 now abandoned.

BACKGROUND OF THE INVENTION

The present invention relates to oxide dielectric materials having as principal constituents barium oxide (BaO) and titanium oxide (TiO$_2$).

Dielectric materials are widely used for impedance matching in a microwave circuit and for dielectrics resonators, etc. This trend has been more and more promoted, and recently, as the communication network develops, the available frequency range also expands into the low frequency region, quasi-millimeter wave region and millimeter wave region. Moreover, as a consequence of the demands for microwave circuit integration as well as the progress in the peripheral technique, the use of dielectric materials having a high and stable dielectric constant and a low loss for oscillators having a stable oscillation frequency, a delay line having a precisely controlled delay time, IC substrates for microwave integrated circuit use, etc., has been positively contemplated.

PRIOR ART

As common dielectric materials in the prior art, BaO-TiO$_2$ system dielectric materials having variously selected composition ratio of BaO to TiO$_2$ have been known. Such dielectric materials present high dielectric constants, but the temperature coefficients of the dielectric constants are of large negative values. Although it is possible to lower the value of the temperature coefficient of a dielectric constant by appropriately selecting the composition ratio of BaO to TiO$_2$, the sintered body is liable to be chemically reduced, and hence, it has a disadvantage that a tan δ becomes large. On the other hand, the generally known sintered alumina bodies and MgTiO$_3$ or CaTiO$_3$ system dielectric materials have a disadvantage in that the dielectric constant is small, or that while the temperature coefficient of the dielectric constant is normally negative, if it is attempted to obtain a small value of the temperature coefficient, then a tan δ becomes large.

The conventional dielectric materials were used as an insulator substrate of an input and/or an output matching circuit for a transistor. Such an input and/or output matching circuit was formed in the so-called microwave integrated circuit (MIC) and was necessitated to have a large impedance conversion ratio. In order to construct this circuit, an extremely low impedance line or an element having an extremely large capacitance was formed on the insulator substrate. The low impedance line was formed by a micro-strip line, and the large capacitance was obtained by using a chip capacitor. However, it was difficult to realize the aforementioned circuit in a satisfactory manner at a high frequency range. Especially in the UHF-band, the wavelength on the above-described micro-strip circuit became several tens of centimeters, and so, for the purpose of miniaturizing the circuit it was necessary to partly use lumped constant elements. On the other hand, the thin film LC elements in the prior art did not possess either the necessary element parameters nor the necessary high frequency characteristics, and furthermore, for a high power output circuit they could not fulfil the essential conditions that heat generation in the circuit should be suppressed by especially reducing circuit loss and that thermal change of the characteristics of the thin film LC elements should be small taking into consideration the heat generation in the active elements such as transistors or the like. Consequently, it was impossible to realize a practical high-frequency high-power output transistor amplifier.

In U.S. Pat. No. 4,037,168 granted to H. Katoh, Y. Kajiwara and H. Takamizawa, an input and/or an output matching circuit for a transistor is formed on a high dielectric constant substrate made of (1−x)BaO.xTiO$_2$. However, in the dielectrics having the composition consisting of only (1−x)BaO.xTiO$_2$, upon sintering, a partly reduced portion that is poor in oxidation is liable to be produced at its central position. This poorly oxidized portion possesses a conductivity to a certain extent, and thus the Q-value is greatly deteriorated. Thus the circuit according to the U.S. patent has a disadvantage in that predetermined characteristics can hardly be obtained because of the poor uniformity in the composition of the dielectric substrate, and moreover, it has an additional disadvantage in that the characteristics of the circuit would vary largely in accordance with temperature because of the above-mentioned large temperature coefficient of the dielectric constant.

SUMMARY OF THE INVENTION

Therefore, it is a principal object of the present invention to provide an oxide dielectric material having a high dielectric constant ($\epsilon$) and a small dielectric loss (tan δ) which can be easily produced so as to have uniform electric properties over a wide range.

Another object of the present invention is to provide an oxide dielectric material whose temperature coefficient of a dielectric constant can be made small.

According to the present invention, there is provided an oxide dielectric material in which the principal constituent is (1−x)BaO.xTiO$_2$ ($0.7 \leq x \leq 0.95$) and which contains manganese in an amount falling in the range of 0.007 to 0.7% by weight with respect to the amount of (1−x)BaO.xTiO$_2$ and zirconium in an amount falling in a range of 0.037 to 3.7% by weight. For obtaining a small temperature coefficient of a dielectric material, it is favorable that the value x is in the range between 0.80 and 0.87.

The addition of both a small quantity of manganese and a small quantity of zirconium to the BaO-TiO$_2$ system oxide dielectric materials results in an excellent dielectric material having a high dielectric constant and a low loss which can reveal excellent performances in the microwave IC use, capacitor use, temperature-compensation use, etc., in which the aforementioned disadvantage of the sintered body being liable to be chemically reduced can be eliminated with an increase in a tan δ being prevented and the temperature coefficient of the dielectric constant can be reduced. In addition, this improved dielectric material has a uniform structure and uniform electric characteristics over an entire region of a broad substrate, and the dielectric constant and the dielectric loss is never locally varied. Since such uniform structure can be obtained without necessitating a strictly controlled manufacturing condition, there is a characteristic advantage that the production of the dielectric material is extremely easy and that a large body of the dielectric material having a uniform structure and a uniform electric characteristics can be obtained.

Moreover, when an input and/or an output matching circuit including a capacitive element is formed by making use of the oxide dielectric material, since a small-sized large-capacity capacitive element can be produced, a matching circuit having a large impedance conversion ratio can be manufactured. Furthermore, since this oxide dielectric material is uniform over a wide range, it can be utilized as a substrate of a hybrid integrated circuit or a microwave integrated circuit, and thereby a semiconductor device that is operable with a low loss up to a microwave band can be obtained. In this case, owing to the high dielectric constant of the improved oxide dielectric material, capacitive elements are reduced in size, and consequently, miniaturization of a semiconductor device can be accomplished.

BRIEF DESCRIPTION OF THE ACCOMPANYING DRAWINGS

The above and further objects, features and advantages of the present invention will become more apparent from the following detailed description of embodiments taken in conjunction with the accompanying drawings:

FIG. 1 (a) is a table showing the dielectric constant $\epsilon$, the Q-value and the temperature coefficient $f_{T.K}$ of resonant frequency for each of different dielectric materials having varied composition proportions of BaO, TiO$_2$, Mn$_2$O$_3$ and ZrO$_2$;

FIG. 1 (b) is a table showing the dielectric constant $\epsilon$, the Q-value and the temperature coefficient d of the dielectric constant $\epsilon$ for each of different dielectric materials having the compositions consisting of only BaO and TiO$_2$;

FIG. 2 (a) is a plan view showing a first example of application of the dielectric material according to the present invention;

FIG. 2 (b) is an equivalent circuit diagram of the same application;

FIG. 3 (b) is an equivalent circuit diagram of the same application;

FIG. 4 (b) is an equivalent circuit diagram of the same application;

FIG. 6 (b) is an enlarged perspective view of a part of the device shown in FIG. 6 (a).

DESCRIPTION OF THE PREFERRED EMBODIMENTS

Figure 3A:
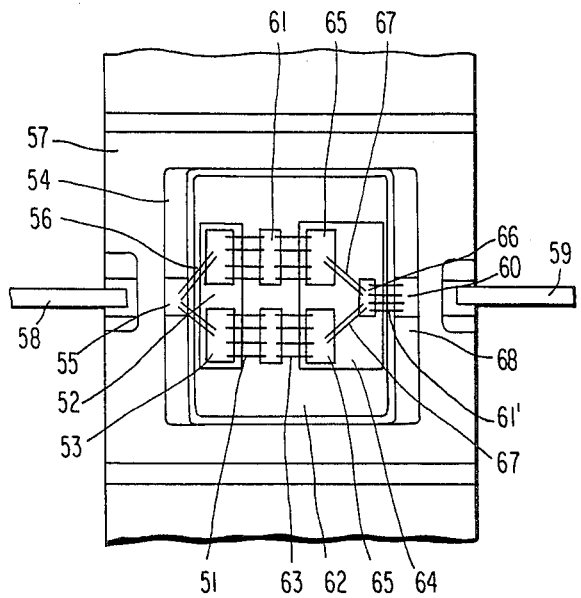
FIG. 3 (a) is a plan view showing a second example of application of the dielectric material according to the present invention.

The respective raw materials of BaCO$_3$, TiO$_2$, Mn$_2$O$_3$ and ZrO$_2$ were weighed in proportion to the respective compositions, then they were mixed within a ball mill made of resin, and after being filtered and dried, the mixture was calcinated for 4 hours at a temperature of 1000° C., and after press-shaping, the shaped body was subjected to sintering for 2 hours at 1250°–1420° C. within the air or within an oxidation atmosphere, whereby an oxide dielectric material principally consisting of (1−x)BaO.xTiO$_2$ and containing both manganese and zirconium was obtained. The table in FIG. 1 (a) shows the values measured at 6 GHz of the dielectric constant, the dielectric loss (represented by a Q-value which is a reciprocal number of the dielectric loss) and the temperature coefficient of a resonant frequency (denoted by $f_{T.K}$) which is a function of a temperature coefficient of dielectric constant, of the aforementioned oxide dielectric materials with the parameter x as well as the contents of the additives Mn$_2$O$_3$ and ZrO$_2$ varied to different values. The temperature coefficient of a resonant frequency ($f_{T.K}$) can be represented by $f_{T.K} \div -\frac{1}{2}d - 8$ where d is a temperature coefficient of the dielectric constant. The table in FIG. 1 (b) also shows dielectric constants ($\epsilon$) measured at 1 MHz and 6 GHz of the X-band, dielectric losses (tan $\delta$) and temperature coefficient (d) of dielectric constant.

As shown in the table in FIGS. 1 (a) and 1 (b), in the case where Mn$_2$O$_3$ and ZrO$_2$ are both added to the oxide dielectric material of which the principal constituent is (1−x)BaO.xTiO$_2$, the $f_{T.K}$ is reduced while holding a high Q-value. In the range where the value x amounts to 0.80 to 0.87 and the additions of Mn$_2$O$_3$ and ZrO$_2$ respectively amount to 0.05–0.1% by weight (0.035–0.07% by weight as converted to Mn) of the (1−x)BaO.xTiO$_2$ and to 0.5–3.5 (0.37–2.6% by weight as converted to Zr) of the oxide dielectric material, the $f_{T.K}$ becomes especially small and presents a value of +10 ppm/°C. to 0 ppm/°C. As the amounts of the additives are increased, when the addition of Mn$_2$O$_3$ exceeds 1.0% by weight (0.7% by weight as converted to Mn) and the addition of ZrO$_2$ exceeds 5.0% by weight (3.7 weight % as converted to Zr), the Q-value is widely lowered and the $f_{T.K}$ takes a large positive value. In the case where the amount of Mn$_2$O$_3$ is less than 0.01% by weight (0.007% by weight as converted to Mn) or the amount of ZrO$_2$ is less than 0.05 (0.037% by weight as converted to Zr), then the remarkable effect of the additives becomes hardly acknowledged such that the sintered body becomes liable to be reduced or the $f_{T.K}$ increases.

The addition of manganese is effective to prevent the reduction of TiO$_2$ in the sintering process. This is apparent from the change of Q-value shown in Table 1. In the case of the oxide dielectric material of 0.1852BaO.0.8148TiO$_2$ and an addition of Mn$_2$O$_3$ of which amount is equal to or less than 0.01% by weight of the 0.1852BaO.0.8148TiO$_2$, TiO$_2$ is easily reduced and the Q-value is lowered. However, if the added value of Mn$_2$O$_3$ increases, the reduction of TiO$_2$ is prevented by Mn$_2$O$_3$ and the high Q-value is maintained. This trend is similarly shown in (1−x)BaO.xTiO$_2$ having other values of x.

TABLE 1

| Added value of MnO$_2$ | Reduction | Q-value |
|---|---|---|
| 0.01 wt. % | large | 2,300 |
| 0.05 wt. % | small | 6,000 |
| 0.10 wt. % | small | 6,300 |
| 0.15 wt. % | small | 6,100 |
| 0.20 wt. % | small | 5,800 |

In (1−x)BaO.xTiO$_2$ containing manganese, the partial change in the Q-value is very small. Two oxide dielectric materials of 0.1852BaO.0.8148TiO$_2$ having a disc shape of 30.3 mm in diameter and 20 mm in thickness are prepared. One contains no manganese and the other contains $Mn_2O_3$ of 0.1% by weight per the $0.1852BaO.0.8148TiO_2$. Table 2 shows Q-values of some parts of the two materials, where (a) is at central inner part, (b) is at peripheral surface part, and (c) is at peripheral inner part.

TABLE 2

| Part | No manganese | Addition of $Mn_2O_3$ 0.1 wt. % |
|---|---|---|
| (a) Central inner | 1020 | 5800 |
| (b) Peripheral surface | 3800 | 6100 |
| (c) Peripheral inner | 3100 | 6100 |

If manganese is not added, the partial change in the Q-value is large. Especially the Q-value at the central inner part is very small. This is because a large amount of chemical reduction of $TiO_2$ occurs at the central inner part in the sintering process. On the other hand, where $Mn_2O_3$ is added, the partial change in the Q-value is very small. Thus, if manganese is added, the chemical reduction of $TiO_2$ is effectively prevented and uniform construction and uniform electrical characteristics can be obtained over a wide range. Further, this small value of reduction is observed without strict temperature control in the sintering process, resulting in ease of manufacturing.

In the case where only $Mn_2O_3$ is added to the oxide dielectric material, while the sintered body is not reduced, the $f_{T.K}$ increases. On the other hand, in the case where only $ZrO_2$ is added, while a small value of the $f_{T.K}$ can be obtained, the sintered body becomes liable to be reduced, the Q-value is small and widely fluctuates, and so, the resulting material is not favorable.

With regard to the parameter x appearing in the formula $(1-x)BaO.xTiO_2$ of the principal components, at $x<0.7$, a tan δ becomes large, and hence the material is not favorable, on the other hand at $x>0.95$ a temperature coefficient of a dielectric constant becomes large, and accordingly, although the composition of the principal components of the dielectric materials according to the present invention is represented by the formula $(1-x)BaO.xTiO_2$, x comes within the range of $0.7 \leq x \leq 0.95$.

The appropriate amounts of manganese (Mn) and zirconium (Zr) to be added according to the present invention are, respectively, 0.007-0.7% by weight and 0.037-3.7% by weight of the weight of the $(1-x)BaO.xTiO_2$. In the addition of manganese and zirconium, no specific limitation to the chemical form thereof is required, but it is a common practice to use a chemical form that is chemically stable and that can be weighed conveniently such as oxides, carbonates, etc. For instance, with regard to barium which is one of the principal components, it is more frequently handled in the form of barium carbonate rather than employing the raw material in the form of barium oxide. In any event, it is convenient that the chemical form to be chosen for the raw material has a wide variety, and indeed, there occur no distinct differences in the effects by varying the chemical form of the raw material.

Here it is to be noted that even in the case of the ceramics having a mere composition of $(1-x)Ba.xTiO_2$ not containing manganese nor zirconium, a high dielectric constant property can be obtained. However, in the case where the ceramic consists only of such composition, especially in the case where a substrate made of the ceramic specimen becomes thick or large in volume, the central inner portion of the sintered body which does not directly contact with the high-temperature atmosphere upon manufacture, is locally reduced, that is, insufficient oxidation occurs at that portion so that it possesses a slight conductivity. Therefore, there exists a disadvantage in that deterioration of the Q-value results as shown in table 2. Especially, in such cases where substrates are sliced from a large block of a sintered body for use as substrates for microwave integrated circuits, uniformity of the composition over the entire substrate is lost and the sliced substrate has a very low Q-value at its central portion. As a matter of course, in the case of a substrate for a microwave integrated circuit, normally the main circuit is formed in its central portion rather than in the edges of the substrate, and hence, in such case circuit loss increases, resulting in a quite unsatisfactory substrate for use in a high power circuit. In the prior art, for the purpose of eliminating this nonuniformity, controls upon manufacture of a sintered body such as, for example, control of the atmosphere upon heating and cooling, control of the temperature and the rate of temperature change, etc. were conducted strictly and delicately, but the rise of cost and the reduction of yields of the substrates due to these controls resulted in the rise of cost of the transistor amplifiers such as microwave integrated circuits, themselves.

In the case of the dielectric materials according to the present invention which principally consists of $(1-x)BaO.xTiO_2$ where x is between 0.7 to 0.95 and contains manganese in a range of 0.007-0.7% by weight of the $(1-x)BaO.xTiO_2$ and zirconium in a range of 0.037-3.7% by weight of the $(1-x)BaO.xTiO_2$, even if the material is produced in the form of a large block of sintered body, uniformity of the composition over the entire dielectric material can be obtained, and thereby a uniform Q-value can be obtained over the entire dielectric material. Moreover, in this case, even if the manufacturing conditions such as the atmosphere upon heating and cooling, the temperature, the rate of temperature change, etc. are not so severely controlled, the uniformity of the composition could be obtained. Consequently, the manufacturing conditions are widely mitigated, and the delicate control of temperature and atmosphere during the sinterng becomes not so critical. Accordingly, dielectric materials can be obtained at a low manufacturing cost and at a high yield.

Embodiment 1

To the principal components represented by the formula $(1-x)BaO.xTiO_2$ where a specific value $x=0.8148$ was chosen, were added varied amounts of $Mn_2O_3$ and $ZrO_2$, respectively. After these raw materials had been mixed, filtered, dried, calcinated and press-shaped under the previously mentioned various conditions the shaped bodies were sintered at 1360°–1420° C. for 2 hours within the air or an oxygen atmosphere, and thereby oxide dielectric materials were obtained.

Embodiment 2

The compositions represented by the formula $(1-x)BaO.xTiO_2$ where specific values $x=0.792$ and $x=0.875$ were chosen, were employed as principal components. Varied amounts of $Mn_2O_3$ and $ZrO_2$, respectively, were added to the principal components, and after these raw materials had been mixed, filtered, dried, calcinated and press-shaped under the same conditions as the Embodiment-1 the shaped bodies were sintered at 1280°–1430° C. for 2 hours within the air or an oxygen atmosphere, and thereby oxide dielectric materials were obtained.

As described above, the oxide dielectric materials according to the present invention have a high dielectric constant, and an extremely small dielectric loss and small temperature coefficient of dielectric constant, and furthermore, according to the present invention, oxide dielectric materials having uniform compositions and uniform properties over a broad range of a block of dielectric material can be obtained. Obviously, these oxide dielectric materials are very useful in the frequency range of the microwave, quasimillimeter wave, etc. due to the fact that the Q-value is high and a temperature coefficient of a dielectric constant is small. Still further, it has been confirmed that the oxide dielectric materials according to the present invention present excellent properties in that even in the low frequency range the dielectric loss and the temperature coefficient of the dielectric constant are small. Also they make excellent materials for use in temperature-compensating ceramic capacitors. In addition, it has been confirmed that with regard to the barium, manganese and zirconium among the constituent elements, even if carbonates or other salts thereof are used, the same effects could be obtained so long as they are converted into the form of oxides by sintering.

In the following, a description will be made of a number of examples of applications of the oxide dielectric materials according to the present invention.

FIG. 2(a) is a plan view to be used for explaining a packaged microwave high power output field effect transistor device associated with a two-stage input single-stage output internal impedance matching circuit which forms a first example of application of the present invention, the device being depicted with the cap of the package removed. FIG. 2(b) is an equivalent circuit diagram of the device depicted in FIG. 2(a).

Referring now to FIG. 2(a), microwave high power output field effect transistor chips 1 having their sources grounded are fixed by brazing on a grounded conductor block 2 which also serves as a radiator. The gate electrodes thereof are connected through conductor wires 3 to upper electrodes 5 of two first parallel capacitive elements formed by a dielectric sheet having a high dielectric constant (Specimen No. 24 in the table in FIG. 1(a)) 4 which elements are also mounted on the grounded conductor block 2. An upper electrode 6 of a second parallel capacitive element formed by the dielectric sheet 4 and the upper electrodes 5 of said first parallel capacitive elements are connected to each other through fine conductor wires 7, and the upper electrode 6 of the second parallel capacitive element is connected through four thin conductor wires 11 to a micro-strip line 10 which is provided on an alumina ceramic substrate 8 forming a capsule 17 having a lead wire 9 at its extremity. The lead wire 9 forms an input terminal. Drain electrodes of the microwave high power output field effect transistor chips 1 are connected through fine conductor wires 15 to a micro-strip line 14 having a parallel capacitive stab 13 provided on an alumina ceramic substrate 12, and the micro-strip line 14 is provided at its extremity with a lead wire 16 forming an output terminal. The above-mentioned structure is accommodated within the capsule 17 having walls made of alumina ceramics. Although not shown in the figure, the capsule 17 has its lid formed of a cap made of ceramics, and an internal matching circuit is sealingly enclosed in the capsule 17.

Referring now to FIG. 2(b) which shows an equivalent circuit diagram of the first example of application illustrated in FIG. 2(a), to a gate electrode 41 of a microwave field effect transistor 21 whose source electrode 40 is grounded, is connected a two-stage low-pass type lumped constant input impedance matching circuit consisting of series inductive elements $L_4$, $L_2$ and $L_0$ formed of fine conductor wires and parallel capacitive elements $C_3$ and $C_1$ to a drain electrode 42 of the same field effect transistor 21 is connected an output impedance matching circuit formed of a series inductive element $L_5$ and a parallel stab 32.

By way of example, a 6 GHz band internal matching circuit making use of microwave high power output GaAs yield effect transistors (2-chip parallel arrangement structure) is considered. Then the respective circuit parameters take the following values.

$L_0 = 0.1$ nH, $L_2 = 0.38$ nH, $L_4 = 0.09$ nH, $C_1 = 1.8$ pF, $C_3 = 7.7$ pF.

Upon producing such capacitors having capacitances of several pico-farads, if parallel-plate type capacitors are constructed by making use of dielectric materials of about 0.1 to 0.2 mm in thickness and having a relative dielectric constant of about 35–70 which can be easily produced and handled, then the capacitors will have about the same order of dimensions as the dimensions of the transistor chips, and hence, they are favorable in view of the manufacturing and assembling works. For such capacitors, capacitors formed of the high dielectric constant sheet according to the present invention are suitable.

As described above, introduction of capacitors formed of the sheets of the high dielectric constant materials has a characteristic advantage in that improvements in reliability and reduction of manufacturing cost can be realized, and especially its effects are remarkable in a microwave high power output transistor device which requires a precise design and which is difficult to manufacture.

FIG. 3(a) is a plan view to be used for explaining a packaged microwave high power output field effect transistor device associated with a two-stage input single-stage output internal impedance matching circuit which forms a second example of application of the present invention making use of an oxide dielectric material. The input matching circuit has the same construction as the first example of application, and the output matching circuit is constructed of a single-stage lumped constant circuit.

Dielectric sheets 52 and 64 made of the oxide dielectric material (Specimen No. 24 in the table in FIG. 1(a)) according to the present invention and two microwave high power output field effect transistor chips 61 are mounted on a grounded conductor block 62 which also serves as a radiator. On the dielectric sheet 64 are mounted two upper electrode metals 65 of first parallel capacitive elements and an upper electrode metal 66 of a second parallel capacitive element, which form the input matching circuit. On the other hand, on the dielectric sheet 52 are mounted two upper electrode metals 53 of third parallel capacitive elements. Around the portion of the grounded conductor block 62 where the chip 61 and the like are mounted, is mounted an alumina ceramics substrate 54 on which metallic layers 60 and 55 of the input and output sections are vapor-deposited, and on the substrate are mounted walls of a capsule 57. To the respective metallic layers 60 and 55 are brazed lead wires 59 and 58, respectively. This capsule 57 has its upper portion omitted from the illustration. The respective transistor chips 61 are mounted on the grounded conductor block 62 in a grounded-source form, and the respective gate electrodes are connected by fine conductor wires 63, 67 and 61' to the metallic layer 60 via the upper electrode metals 65 of the first parallel capacitive element and the upper electrode metal 66 of the second parallel capacitive element. Drain electrodes of the transistor chips 61 are connected respectively by four fine conductor wires 51 to the two upper electrodes 53 of the third parallel capacitive elements formed by the high dielectric constant dielectric sheet 52 (Specimen No. 24 in the table in FIG. 1(a)), and said upper electrodes 53 are connected by four thin conductor wires 56 to a micro-strip line 55 formed on the alumina ceramic substrate 54 and having a lead wire 58 at its extremity. The lead wire 58 forms an output terminal.

Figure 3B:
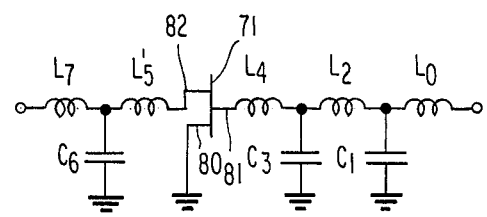

FIG. 3(b) shows an equivalent circuit diagram of the second example of application, in which the section of the input matching circuit is identical to the equivalent circuit of the first example of application shown in FIG.2(b). In FIG. 3 (b), a gate electrode 81 of a transistor chip 71 is connected to an input matching circuit which comprises series inductive elements $L_4$, $L_2$ and $L_0$ respectively formed by the thin conductor wires 63, 67 and 61' and parallel capacitive elements $C_3$ and $C_1$. The circuit parameters of inductive elements $L_4$, $L_2$ and $L_0$ and capacitive elements $C_3$ and $C_1$ are the same values as of FIG. 2(b). To a drain electrode 82 of the transistor chip 71 is connected an output impedance matching circuit consisting of a series inductive element $L_5'$ (for example 0.40 nH), a parallel capacitive element $C_6$ (for example 1.48 pF) and a series inductive element $L_7$ (for example 0.1 nH). The series inductive elements $L_0$, $L_2$, $L_4$, $L_5'$ and $L_7$ are respectively formed of the thin conductive wires 61', 67, 63, 51 and 56.

While description has been made above with respect to the case where the input matching circuit consists of two stages and the output matching circuit consists of a single stage in the first and second examples of application, obviously the circuit construction is not limited to the illustrated constructions but various modifications could be made in the construction. In addition, with respect to the semiconductor elements, obviously the present invention is not limited to field effect transistors, but the invention is equally applicable to bipolar transistors.

Figure 4A:
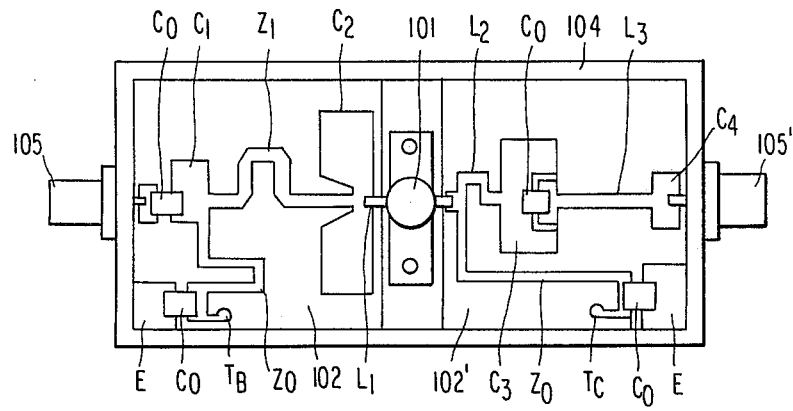
FIG. 4 (a) is a plan view showing a third example of application of the dielectric material according to the present invention.
Figure 4B:
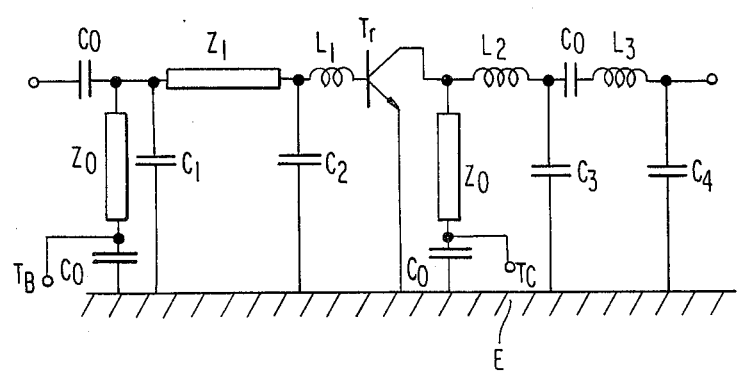

A third example of application of the dielectric material according to the present invention is illustrated in FIGS. 4(a) and 4(b). FIG. 4(a) is a plan view of a transistor amplifier, and FIG. 4(b) is an equivalent circuit of the same transistor amplifier. Referring to FIG. 4(a), on the front side and rear side of a UHF high power output transistor 101 provided on a grounded conductor, are disposed dielectrics substrates 102 and 102' made of the dielectric material according to the present invention (Specimen No. 24 in the table in FIG. 1(a)), input and output circuits are formed on these substrates 102 and 102' in a microwave IC form, and these elements are accommodated within a case 104 which serves also as a grounded conductor to form a UHF high power output transistor amplifier having input and output connectors 105 and 105'. The input matching circuit comprises a low-pass circuit consisting of $L_1$ and $C_2$ that is further added with a ¼ wavelength transformer $Z_1$ and an adjusting capacitor $C_1$, and the output matching circuit comprises a low-pass circuit consisting of $L_2$, $C_3$, $L_3$ and $C_4$. Additionally $C_0$ represents a DC block or an RF short-circuiting capacitor, $Z_0$ represents a ¼ wavelength choke line, $T_B$ represents a base terminal, $T_C$ represents a collector terminal and E represents an earth terminal. The back surface of the entire substrate forms a grounded conductor, and the earth terminals E and F are connected to this grounded conductor.

By way of example, considering the use of CT 1933 transistors manufactured by CTC in the United States which have an output of 20 W in the UHF-band, the resistive components of the input and output impedances thereof are, for example, 1.25 ohm and 3.3 ohm respectively, and the parameter values of the circuit elements of the matching circuit in FIG. 4(a) for converting these impedances to 50 ohms within a relative bandwidth of short 40% about the center frequency of 600 MHz, are, for example, as follows:

$L_1 = 0.5$ nH, $C_2 = 134$ pF, $Z_1 = 14$ ohm, $L_2 = 1.88$ nH, $C_3 = 43$ pF, $L_3 = 7.3$ nH, $C_4 = 11.3$ pF.

Here, the capacitors $C_2$ and $C_3$ are required to have large capacitance values for the purpose of effecting impedance conversion while maintaining a Q-value of the transistor Tr and the inductors $L_1$ and $L_2$ before and after the transistor Tr. However, in the case of the conventional chip type laminated ceramics capacitor or thin film capacitor, self-resonance would occur in the UHF-band if the capacitor has such a large capacitance value, and so, they are not used. Especially in the case of a high power output use, association of a self-inductance of several tenths nano-henry cannot be avoided in view of the dimension of the capacitor. In this respect, a single plate type capacitor whose one electrode per se is a grounded conductor, is most appropriate, and for the purpose of realizing a large capacitance in such form, a high dielectric constant dielectric substrate is suitable. If the dielectric material of the Specimen No. 24 in the table in FIG. 1(a) is used as the substrate 102 and the sheet thickness is chosen at 0.25 mm, then a capacitance of about 100 pF can be obtained for an area of about 1 cm². Furthermore, if this substrate for capacitive use is in itself used as an IC substrate, and if an IC device is formed on the same substrate jointly with $C_3$, $C_4$ or $C_1$, $C_2$, then the device is preferable with respect to its cost and labor for manufacture.

In the third example of application of the invention illustrated in FIGS. 4(a) and 4(b), furthermore a ¼ wavelength impedance converter line is used, and in the wide-band matching circuit often such a converter is used. This converter is required to have a characteristic impedance of about 14 ohms in order to convert the input side impedance of the transistor 101 which has been converted to about 4 ohms by $L_1$ and $C_1$ to 50 ohm. As will be seen from this example, in a high power output transistor amplifier, a line having an extremely low characteristic impedance is required. Comparing now the line widths in the case of realizing a line having a characteristic impedance of 5-20 ohms by making use of the conventional alumina substrate and the above-described dielectric material substrate, when the sheet thickness is chosen at 0.5 mm, the line widths take the following values described in Table 3:

TABLE 3

| Characteristic Impedance | Alumina Substrate | Dielectric Material Substrate According to the Present Invention |
|---|---|---|
| 20 ohms | 2.25 mm | 0.75 mm |
| 10 ohms | 5.5 mm | 2.25 mm |

TABLE 3-continued

| Characteristic Impedance | Alumina Substrate | Dielectric Material Substrate According to the Present Invention |
| --- | --- | --- |
| 5 ohms | 10 mm | 5 mm |

Accordingly, in the case of the conventional alumina substrate, it is very difficult to use a line having a characteristic impedance of about 10 ohms on the conventional IC substrate of 10–20 mm squares.

Moreover, this converter necessitates a length equal to a ¼ wavelength, and when a frequency of, for example, 600 MHz in the UHF-band is considered, by way of example, the length of a ¼ wavelength is 50 mm in the case of alumina, whereas it is 25 mm in the case of the high dielectric constant dielectric substrate according to the present invention. Accordingly, it is very difficult to form an amplifier within a practical size of several centimeters by making use of an alumina substrate.

By employing the dielectric material according to the present invention as a substrate, it becomes possible to realize a large capacitance that is about 3 to 10 times as large as that in an alumina substrate IC circuit and a low impedance line whose area is about ⅓ to 1/10 as small as that in an alumina substrate IC circuit, whereby a wide-band high-performance UHF-band power transistor amplifier can be easily realized with a practical size of several centi-meters.

It is to be noted that in the third example of application of the invention, the series inductors $L_2$ and $L_3$ in the low-pass filter circuit are also formed on the high dielectric constant substrate 102. Although this design is easy to manufacture, on the other hand these inductors have large parallel capacitances and approximate to distributed constant lines. Therefore, in order to further miniaturize the circuit or to form lumped constant inductors having enhanced Q-values, it is necessary to raise the impedance with respect to the ground as high as possible. Improvements in this regard are made in the fourth example of application of the invention illustrated in FIG. 5.

Figure 5:
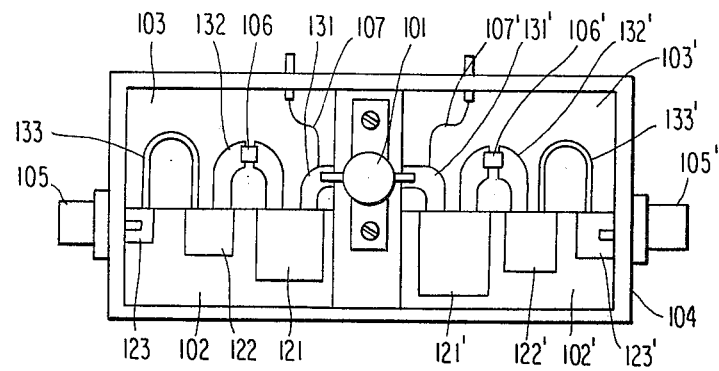
FIG. 5 is a plan view showing a fourth example of application of the dielectric material according to the present invention.

FIG. 5 is a plan view showing the fourth example of application of the dielectric materials according to the present invention. On the opposite sides of a high-frequency high-output transistor 101 are respectively formed three-stage low-pass type matching circuits to construct an amplifier. In this construction, on high dielectric constant substrates 102 and 102' are formed single-plate type capacitive elements 121, 122, 123 and 121', 122', 123' which make use of the substrates 102 and 102' as their dielectric layers, to form parallel capacitors. Capacitances of the capacitive elements 121, 122, 123, 121', 122', 123' are designed to 135 pF, 40 pF, 9 pF, 60 pF, 25.5 pF and 7.2 pF, respectively. The entire back surfaces of the high dielectric constant substrates 102 and 102 not seen in FIG. 5 serve a grounded surfaces and metallic layers are formed on these surfaces.

In the above-described example of application, series inductors connected to these capacitors at the boundaries between substrates are formed on separate dielectric substrates 103 and 103' as shown at 131, 132, 133 and 131', 132', 133'. Inductances of the inductors 131, 132, 133, 131', 132°, and 133' are designed to 0.47 nH, 2.5 nH, 8.5 nH, 1.18 nH, 4.2 nH and 10.1 nH, respectively. Reference numeral 104 designates a case, numerals 105, 105' designate input and output connectors, numerals 106, 106' designate blocking capacitors, having capacitors of 1000 pF and numerals 107, 107' designate choke circuits for biasing.

In this example of application, with regard to capacitors, by merely forming isolated electrodes on the high dielectric constant substrate made of the dielectric material according to the present invention with the aid of the IC technique similar to the first example of application, capacitors having extremely large capacitances and adapted to high-frequency use can be obtained easily. On the other hand, as the dielectric substrates 103, 103' the conventional dielectrics for IC use such as alumina, quartz, etc. could be employed in itself. Then the impedances of the inductor lines can be made sufficiently high and excellent high-frequency characteristics can be obtained.

Figure 6A:
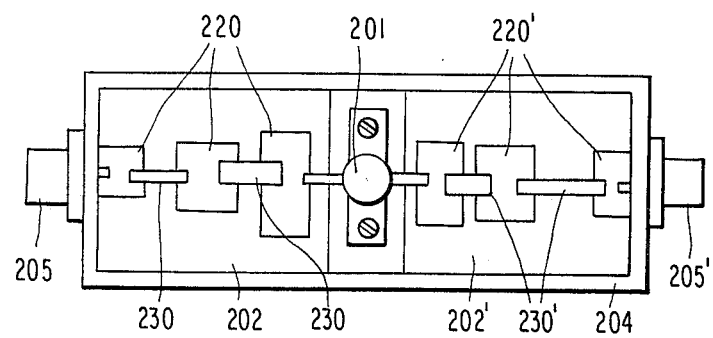
FIG. 6 (a) is a plan view showing a fifth example of application of the dielectric material according to the present invention.
Figure 6B:
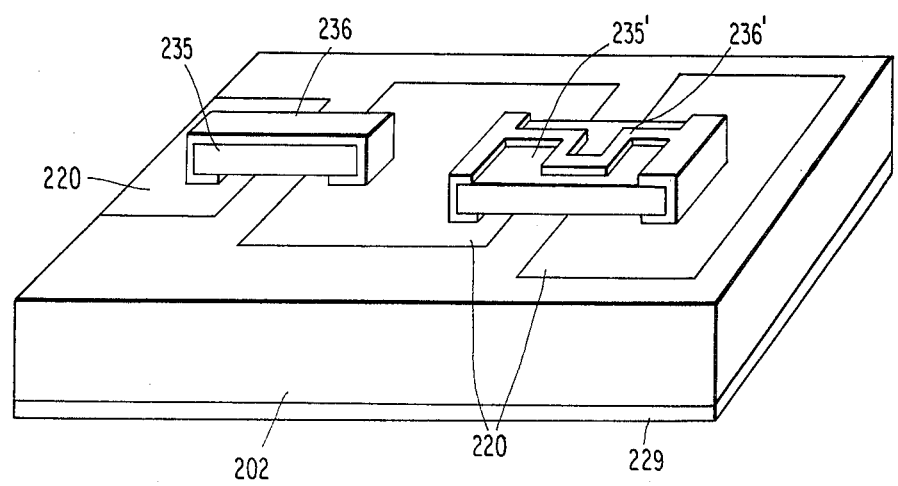

FIGS. 6(a) and 6(b) show the fifth example of application of the dielectric materials according to the present invention, FIG. 6(a) being a plan view, and FIG. 6(b) is an enlarged perspective view of a part of the device in FIG. 6(a). In this example of application also, similar to the third and fourth examples of application as described above, parallel capacitors 220 and 220' are formed on high dielectric constant substrate 202 and 202', respectively, which make use of the dielectric materials according to the present invention. However, as the inductors to be inserted serially between these capacitors, chip type inductors 230 and 230' formed on separate chip-shaped dielectrics are used. FIG. 6(b) shows such chip type inductors on an enlarged scale. As will be seen from this figure, the chip inductors are constructed in the form of conductor patterns 236 and 236' formed on chip-shaped substrates 235 and 235' made of conventional dielectrics such as alumina or the like, and these chips are directly placed on the capacitor electrodes 220 and electrically connected thereto. As to the capacitors, a large capacitance can be obtained between the electrode 220 and a grounded conductor 229 on the back surface of the high dielectric constant substrate 202. The undesired parallel capacitances of the inductors 236 and 236' are determined mainly by the chip-shaped dielectric substrates 235 and 235', thus inductors having excellent high-frequency characteristics can be obtained, and thereby a high-frequency high power output transistor amplifier that is small in size and has high performance, can be realized.

While the chip-shaped inductors were employed in the form of external mount elements in the above-described example of application, in a further advanced integrated circuit form the inductors can be realized without employing the chip-shaped dielectrics substrates on which the chip-shaped inductor conductors are formed. That is, in place of the chip-shaped dielectric substrate, a thin or thick dielectric film having a small dielectric constant is directly formed on the high dielectric constant substrate 202 or 202' and a part of the electrodes of the parallel capacitors 220 or 220', thereafter a thin or thick conductor film is deposited on the upper surface of the formed dielectric film, and that conductor film could be used as a conductor of the inductor. As a matter of course, exactly the same effects as the above-described example of application can be obtained with such a modified structure. In addition, as a more simplified method, one or more thin conductor wires or conductor tapes having a certain extent of diameter or thickness could be bridged in parallel between the electrodes 220, 220' of the parallel capacitors as by ultrasonic bonding or heat-press bonding. In this case, the dielectric supporting the inductors is air, which has the minimum dielectric constant, and hence the object of amplication can be achieved up to a higher frequency.

While a single-stage amplifier employing a packaged transistor was illustrated and described in all the third to fifth examples of application of the invention, modification could be made in such manner that transistor chips are used and directly mounted on an insulator layer provided on the grounded conductor 229 and circuit wiring is made to these transistor chips. In addition, the present invention is equally applicable to the case where transistor circuits are provided in multiple stage or in multi-stage parallel form and these transistor circuits are formed on the same substrate jointly with the input, output and inter-stage circuits to form a large-scale integrated circuit.

What is claimed is:

1. A transistor device having an internal impedance matching circuit, comprising a conductor block, a transistor chip having input, output and common electrodes, said common electrode of said transistor chip being connected to said conductor block, a sheet of dielectric material directly mounted on said conductor block, an electrode layer formed on said dielectric material and electrically connected to said input electrode and/or said output electrode of said transistor chip, said electrode layer cooperating with said dielectric material and said conductor block to constitute a capacitive element in said internal impedance matching circuit, a conductive layer electrically to said electrode layer and separated from said conductor block by an insulating layer, said conductive layer cooperating with said insulating layer and said conductor block to constitute a strip line, a lead wire connected to said conductive layer, and a package housing encapsulating at least said transistor chip and said sheet of dielectric material, said dielectric material having as a principal constituent $(1-x)BaO \cdot xTiO_2$, where the parameter $x$ falls in the range of $0.7 \leq x \leq 0.95$, and containing manganese in an amount of 0.035 to 0.07% by weight per amount of said principal constituent and zirconium in an amount of 0.37 to 2.6% by weight per amount of said principal constituent.

2. A transistor device as claimed in claim 1, in which said manganese and zirconium included in said dielectric material are in the form of metal oxides, the amount of the oxide of manganese being 0.05 to 0.1% by weight per amount of said principal constituent, and the amount of the oxide of zirconium being 0.5 to 3.5% by weight per amount of said principal constituent.

3. A transistor device as claimed in claim 1, further comprising an additional transistor chip which has a common electrode connected to said conductor block and input and output electrodes, one of which is electrically connected to an additional electrode formed on said dielectric layer, said additional electrode layer being electrically connected to said conductive layer.

4. A transistor device having input and output internal impedance matching circuits, comprising a conductor block, first and second transistor chips mounted on said conductor block and having input and output electrodes, respectively, a dielectric sheet directly mounted on said conductor block, first, second, and third upper electrodes formed separately on said dielectric sheet, means for electrically connecting said input electrode of said first transistor chip to said first upper electrode, means for electrically connecting said input electrode of said second transistor chip to said second upper electrode, means for electrically connecting said third upper electrode to said first and second upper electrodes, said first, second, and third upper electrodes cooperating with said dielectric sheet and said conductor block to form capacitive elements for said input internal impedance matching circuit, a first strip line having one end portion electrically connected to said third upper electrode and another end portion, a second strip line having a parallel capacitive slab for said output internal impedance matching circuit, said parallel capacitive slab being electrically connected to the output electrodes of said first and second transistor chips, said first and second strip lines using said conductor block as a common conductor, an input lead connected to said other end portion of said first strip line, an output lead connected to said second strip line, and means for sealing said two transistor chips and input and output internal impedance matching circuits, said dielectric sheet consisting essentially of a principal constituent $(1-x)BaO \cdot xTiO_2$ where the parameter $x$ falls in the range of $0.7 \leq x \leq 0.95$, manganese in an amount of 0.035 to 0.07% by weight per amount of said principal constituent, and zirconium in an amount of 0.37 to 2.6% by weight per amount of said principal constituent.

5. A transistor device as claimed in claim 4, wherein each of said two transistor chips is a field effect transistor having a gate electrode serving as said input electrode, a drain electrode serving as said output electrode and a source electrode connected to said conductor block, respectively.

6. A transistor device having input and output internal impedance matching circuits, comprising a conductor block, two transistor chips mounted on said conductor block and having input and output electrodes, respectively, two dielectric sheets directly mounted on said conductor block, respectively, a first upper electrode formed on one dielectric sheet and electrically connected to the input electrode of one transistor chip, a second upper electrode formed on said one dielectric sheet and electrically connected to the input electrode of the other transistor chip, a third upper electrode formed on said one dielectric sheet and electrically connected to said first and second upper electrodes, said first, second and third upper electrodes cooperating with said one dielectric sheet and said conductor block to constitute capacitive elements for said input internal impedance matching circuit, a fourth upper electrode formed on the other dielectric sheet and electrically connected to the output electrode of said one transistor chip, a fifth upper electrode formed on said other dielectric sheet and electrically connected to the output electrode of said other transistor chip, said fourth and fifth upper electrodes cooperating with said other dielectric sheet and said conductor block to constitute capacitive elements for said output internal impedance matching circuit, an insulating layer mounted on said conductor block and having an opening including said two transistor chips and said two dielectric sheets therein, a first metallized layer formed on said insulating layer and cooperating with said insulating layer and said conductor block to constitute a strip line and having one end portion electrically connected to said third upper electrode and the other end portion, a second metallized layer formed on said insulating layer and cooperating with said insulating layer and said conductor block to constitute a strip line and having one end portion electrically connected to said fourth and fifth upper electrodes and another end portion, a first lead wire as an input terminal connected to said other end portion of said first metallized layer, a second lead wire as an output terminal connected to said other end portion of said second metallized layer, and means for sealing said two transistor chips, said two dielectric sheets and said one end portion of said first and second metallized layers, said two dielectric sheets consisting essentially of a principal constituent $(1-x)BaO \cdot xTiO_2$ where the parameter x falls in the range of $0.7 \leq x \leq 0.95$, manganese in an amount of 0.035 to 0.07% by weight per amount of said principal constituent, and zirconium in an amount of 0.37 to 2.6% by weight per amount of said principal constituent.

7. A transistor device as claimed in claim 6, wherein said insulating layer is an alumina ceramic substrate.

8. A transistor device as claimed in claim 6, wherein each of said two transistor chips is a field effect transistor having a gate electrode serving as said input electrode, a drain electrode serving as said output electrode and a source electrode connected to said conductor block, respectively.

* * * * *

UNITED STATES PATENT AND TRADEMARK OFFICE
CERTIFICATE OF CORRECTION

PATENT NO. : 4,353,047
DATED : October 5, 1982
INVENTOR(S) : Tsutomu NOGUCHI et al.

It is certified that error appears in the above—identified patent and that said Letters Patent is hereby corrected as shown below:

Col. 11, line 57, change "and 102" to --and 102'--;
        line 57, change "serve a" to --serve as--.
Col. 13, line 30, change "electrically to" to
        --electrically connected to--.
Col. 14, line 9, change "slab" to --stab--;
        line 11, change "slab" to --stab--.

Signed and Sealed this

Eighteenth Day of January 1983

[SEAL]

Attest:

GERALD J. MOSSINGHOFF

*Attesting Officer*     *Commissioner of Patents and Trademarks*